United States Patent
Hasebe et al.

(10) Patent No.: US 7,651,733 B2
(45) Date of Patent: Jan. 26, 2010

(54) METHOD FOR FORMING A VAPOR PHASE GROWTH FILM

(75) Inventors: Kazuhide Hasebe, Nirasaki (JP); Hiroyuki Yamamoto, Oshu (JP); Takahito Umehara, Nirasaki (JP); Masato Kawakami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 107 days.

(21) Appl. No.: 11/407,354

(22) Filed: Apr. 20, 2006

(65) Prior Publication Data

US 2006/0257568 A1 Nov. 16, 2006

Related U.S. Application Data

(62) Division of application No. 10/381,908, filed on Mar. 31, 2003, now abandoned.

(30) Foreign Application Priority Data

Apr. 25, 2001 (JP) ............................. 2001-128068
Mar. 13, 2002 (WO) ...................... PCT/JP02/02378

(51) Int. Cl.
*C23C 16/00* (2006.01)
(52) U.S. Cl. ............................. 427/255.23; 427/255.28; 427/255.31
(58) Field of Classification Search ............. 427/248.1, 427/255.23, 255.28, 255.31
See application file for complete search history.

(56) References Cited

U.S. PATENT DOCUMENTS

| 3,756,511 | A | | 9/1973 | Shinroku et al. | |
|---|---|---|---|---|---|
| 4,263,872 | A | * | 4/1981 | Ban | ........................... 118/721 |
| 4,807,562 | A | | 2/1989 | Sandys | |
| 5,015,330 | A | * | 5/1991 | Okumura et al. | ............. 438/694 |

(Continued)

FOREIGN PATENT DOCUMENTS

EP 0 308946 3/1989

(Continued)

OTHER PUBLICATIONS

International Preliminary Examination Report (PCT/IPEA/409) (translated) issued for PCT/JP02/02378.

(Continued)

*Primary Examiner*—David Turocy
(74) *Attorney, Agent, or Firm*—Smith, Gambrell & Russell, LLP

(57) ABSTRACT

A vapor-phase growing unit of this invention includes: a reaction container in which a substrate is arranged, a first gas-introducing part having a first gas-introducing tube in which a gas-spouting port opening in the reaction container is formed, the first gas-introducing part serving to supply into the reaction container a first gas consisting of an organic-metal including gas, and a second gas-introducing part having a second gas-introducing tube in which a gas-spouting port opening in the reaction container is formed, the second gas-introducing part serving to supply into the reaction container a second gas which reacts with the organic-metal including gas and whose density is smaller than that of the organic-metal including gas. The gas-spouting port of the first gas-introducing tube and the gas-spouting port of the second gas-introducing tube are arranged along an outside periphery of the substrate arranged in the reaction container.

4 Claims, 6 Drawing Sheets

U.S. PATENT DOCUMENTS

| | | | |
|---|---|---|---|
| 5,383,984 A | * | 1/1995 | Shimada et al. ........ 156/345.26 |
| 5,618,349 A | | 4/1997 | Yuuki |
| 5,925,188 A | | 7/1999 | Oh |
| 6,146,461 A | | 11/2000 | Yang et al. |
| 6,204,194 B1 | | 3/2001 | Takagi |
| 6,383,300 B1 | * | 5/2002 | Saito et al. ................... 118/715 |
| 6,402,849 B2 | | 6/2002 | Kwag et al. |
| 6,413,884 B1 | * | 7/2002 | Moriyama ................... 438/784 |
| 6,435,865 B1 | | 8/2002 | Tseng et al. |
| 6,634,314 B2 | | 10/2003 | Hwang et al. |
| 2001/0025605 A1 | | 10/2001 | Nagakura |
| 2002/0048860 A1 | | 4/2002 | Moriyama |
| 2002/0124800 A1 | | 9/2002 | Moriyama |
| 2003/0049372 A1 | | 3/2003 | Cook et al. |
| 2003/0164143 A1 | | 9/2003 | Toyoda et al. |

FOREIGN PATENT DOCUMENTS

| | | | |
|---|---|---|---|
| EP | 0 889 407 | | 12/1998 |
| JP | 1-150319 | | 6/1989 |
| JP | 1-235236 | | 9/1989 |
| JP | 01235236 A | * | 9/1989 |
| JP | 2000-208425 | | 7/2000 |
| JP | 2000208425 A | * | 7/2000 |
| JP | 2000223430 A | * | 8/2000 |
| JP | 2000-295411 | | 10/2000 |
| JP | 2000311862 A | * | 11/2000 |

OTHER PUBLICATIONS

Notification of Transmittal of Translation of the International Preliminary Examination Report (PCT/IB/338) issued for PCT/JP02/02378.

ULSI Technology, edited by C.Y. Chang and S.M. Sze, International Editions 1996.

* cited by examiner

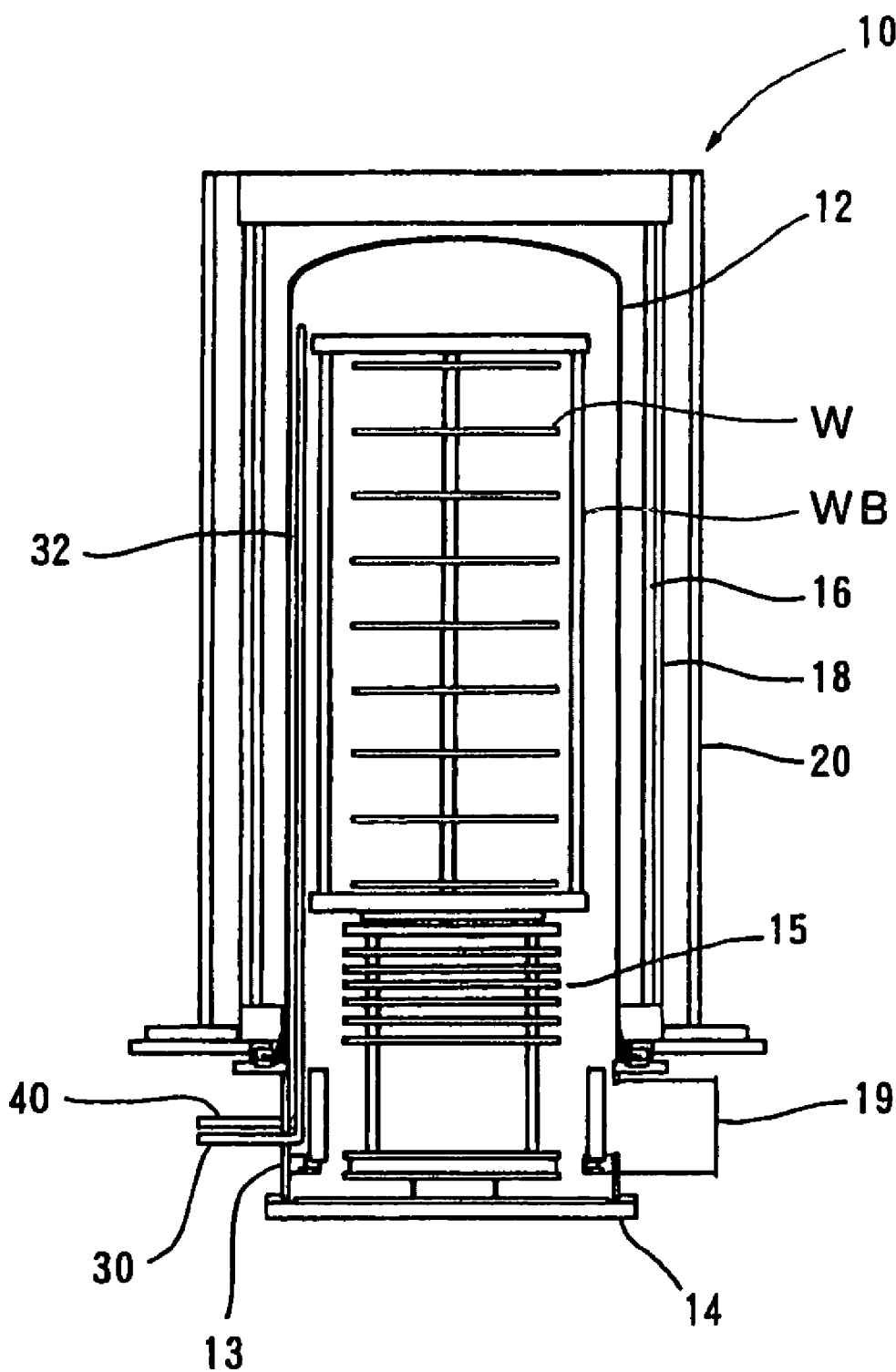
F I G. 1

METHOD FOR FORMING A VAPOR PHASE GROWTH FILM

CROSS REFERENCE TO RELATED APPLICATION

This application is a divisional of U.S. patent application Ser. No. 10/381,908, filed Mar. 31, 2003, now abandoned.

BACKGROUND OF THE INVENTION

1. Field of the Invention

This invention relates a vapor-phase growing unit and a method of forming a vapor-phase-growth film, for forming the vapor-phase-growth film on a surface of a tabular or planar substrate such as, for example, a semiconductor wafer by using a plurality of source gases.

2. Description of the Related Art

Various processes are performed on a substrate made of, for example, a semiconductor wafer or the like, in a fabrication of a semiconductor device. For example, a plurality of source gases may be used in a method of forming a vapor-phase-growth film such as, for example, a CVD method and the like.

Particularly, it is possible to form a vapor-phase-growth film of $SrTiO_3$ on a surface of a silicon wafer by a CVD method, in which, for example, an organic-metal including gas that includes strontium (Sr) and titanium (Ti) and oxygen gas are used. This vapor-phase-growth film is useful for example as a capacitor insulating film because of properties thereof.

Generally, formation of a vapor-phase growth film on a wafer by a plurality of source gases is performed usually by using a reaction container in which a plurality of gas-introducing tubes are arranged, placing the wafer in this reaction container, and heating while spouting the source gases form the respective gas-introducing tubes.

Usually, as for a gas-introducing tube in a conventional vapor-phase growing unit, a straight quartz tube having a gas-spouting port formed by a circular through hole at a peripheral wall thereof has been widely known. In addition, another tube having a gas-spouting port formed by a slit-like through hole extending along a circumferential direction thereof has also been known.

In the conventional vapor-phase growing unit, when an organic-metal including gas is used as a source gas, a front-face direction of the gas-spouting port of the gas-introducing tube is set to be oriented toward a center of a wafer so that the source gas is spouted in a direction toward the center of the wafer along a surface of the wafer. Nonetheless, practically, an in-plane ununiformity (ununiformity within the surface) in a vapor-phase-growth film formed on the surface of the wafer is significantly great. After all, there is a problem that it is impossible to form a vapor-phase-growth film having a high uniformity and desired properties.

For example, when an organic-metal including gas that includes strontium (Sr) and Titanium (Ti) and oxygen gas are used, a desired crystal growth cannot be generated on a substrate with a high in-plane uniformity, whereby it is impossible to form the objective vapor-phase-growth film.

Intensive studies on the above problem suggest that it is caused by a significantly great in-plane ununiformity in distribution of the organic-metal including gas on the surface of the wafer.

Specifically, the organic-metal including gas is a gas of high density. Accordingly, when the gas-spouting port of the gas-introducing tube has a circular shape, as for the formed vapor-phase-growth film, a certain degree of the uniformity can be obtained in a small area in a front-face direction of the gas-spouting port (that is to be a direction of a diameter R of the wafer). However, in a lateral direction vertical to the front-face direction, in proportion to the distance from the gas-spouting port, the film thickness is sharply decreased. That is, the state comes to a state of a great ununiformity.

Consequently, a gas-introducing tube whose gas-spouting port is formed by a slit-like through hole extending in a surface-direction of a wafer was used. As a result, the gas spreads in the lateral direction in an area of a small distance from the gas-spouting port. Therefore, as for the formed vapor-phase-growth film, the uniformity of the film thickness was improved in a certain degree in the lateral direction vertical to the front-face direction of the spouting port (that is to be the direction of a diameter R of the wafer). However, in the front-face direction, in proportion to the distance from the gas-spouting port, the film thickness is sharply decreased. After all, it reveals that the state becomes a state of a great ununiformity.

SUMMARY OF THE INVENTION

This invention is created based on the above consideration, and an object of the invention is to provide a vapor-phase growing unit capable of forming a vapor-phase-growth film on a surface of a tabular substrate such as a wafer with a high uniformity, by a plurality of source gases including an organic-metal including gas.

Another object of the present invention is to provide a method of forming a vapor-phase growth film capable of forming the vapor-phase-growth film on a surface of a tabular substrate with a high uniformity, by a plurality of source gases including an organic-metal including gas.

The present invention is a vapor-phase growing unit comprising: a reaction container in which a substrate is arranged; a first gas-introducing part having a first gas-introducing tube in which a gas-spouting port opening in the reaction container is formed, the first gas-introducing part serving to supply into the reaction container a first gas consisting of an organic-metal including gas; and a second gas-introducing part having a second gas-introducing tube in which a gas-spouting port opening in the reaction container is formed, the second gas-introducing part serving to supply into the reaction container a second gas which reacts with the organic-metal including gas and whose density is smaller than that of the organic-metal including gas; wherein the gas-spouting port of the first gas-introducing tube and the gas-spouting port of the second gas-introducing tube are arranged along an outside periphery of the substrate arranged in the reaction container.

According to this invention, since a flow of the first gas supplied into the reaction container by the first gas-introducing part can be influenced by a flow of the second gas supplied into the reaction container by the second gas-introducing part, the first gas consisting of the organic-metal including gas may be supplied on the substrate with a high uniformity. Therefore, a desired vapor-phase-growth film can be formed on a whole surface of the substrate with a high uniformity.

Preferably, the first gas introduced into the reaction container through the gas-spouting port of the first gas-introducing tube is adapted to be diffused or dispersed along a surface of the substrate because of effect of a flow of the second gas introduced into the reaction container through the gas-spouting port of the second gas-introducing tube.

In addition, preferably, the gas-spouting port of the first gas-introducing tube is formed by a slit-like through hole that opens in a direction parallel to a surface of the substrate. In the case, preferably, the slit-like through hole has an angle of aperture of 30 degree to 160 degree, with respect to the first gas-introducing tube.

Alternatively, preferably, the gas-spouting port of the first gas-introducing tube is formed by a plurality of slit-like portions that open in a direction parallel to a surface of the substrate, and an intermediate wall exists between adjacent two slit-like portions.

In addition, preferably, the gas-spouting port of the second gas-introducing tube is formed by a circular through hole.

In addition, preferably, a front-face direction of the gas-spouting port of the first gas-introducing tube and a front-face direction of the gas-spouting port of the second gas-introducing tube are oriented toward the center of the substrate arranged in the reaction container. In the case, preferably, the front-face direction of the gas-spouting port of the first gas-introducing tube and the front-face direction of the gas-spouting port of the second gas-introducing tube make an angle not more than 45 degree.

In addition, preferably, a plurality of substrates are adapted to be arranged at intervals in a vertical direction in the reaction container, a plurality of gas-spouting ports of the first gas-introducing tube are provided correspondingly to respective heights of the substrates, and a plurality of gas-spouting ports of the second gas-introducing tube are provided correspondingly to the respective heights of the substrates.

In addition, preferably, each of the first gas and the second gas is any of
(1) $Sr[[(CH_3)_3CCO]_2CH]_2$ gas and $O_2$ gas,
(2) $Ti(OC_3H_7-i)_2[[(CH_3)_3CCO]_2CH]_2$ gas and $O_2$ gas,
(3) $TiCl_4$ gas and $NH_3$ gas,
(4) $Zr[OC(CH_3)_3]_4$ gas and $O_2$ gas, and
(5) $Ta(OC_2H_5)_5$ gas and $O_2$ gas.

Furthermore, this invention is a method of forming a vapor-phase-growth film on a surface of a substrate by using a vapor-phase growing unit, the vapor-phase growing unit including: a reaction container in which a substrate is arranged; a first gas-introducing part having a first gas-introducing tube in which a gas-spouting port opening in the reaction container is formed, the first gas-introducing part serving to supply into the reaction container a first gas consisting of an organic-metal including gas; and a second gas-introducing part having a second gas-introducing tube in which a gas-spouting port opening in the reaction container is formed, the second gas-introducing part serving to supply into the reaction container a second gas which reacts with the organic-metal including gas and whose density is smaller than that of the organic-metal including gas; the gas-spouting port of the first gas-introducing tube and the gas-spouting port of the second gas-introducing tube being arranged along an outside periphery of the substrate arranged in the reaction container; the method comprising: a step of supplying the first gas from the gas-spouting port of the first gas-introducing tube into the reaction container; and a step of supplying the second gas from the gas-spouting port of the second gas-introducing tube into the reaction container.

Preferably, the step of supplying the first gas from the gas-spouting port of the first gas-introducing tube into the reaction container and the step of supplying the second gas from the gas-spouting port of the second gas-introducing tube into the reaction container are conducted at the same time.

BRIEF DESCRIPTION OF THE DRAWINGS

FIG. 1 is a schematic cross sectional view showing a vapor-phase growing unit according to an embodiment of the present invention;

DESCRIPTION OF THE PREFERRED EMBODIMENT

Figure 2:
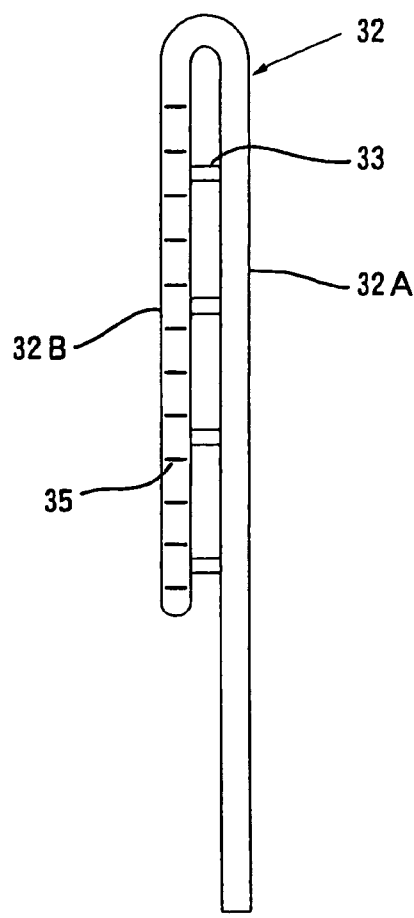
FIG. 2 is a schematic view of the first gas-introducing tube in FIG. 1 seen from the center of a wafer.

The present invention will be explained in detail with reference to the drawings.

FIG. 1 is a view schematically showing an example of a vapor-phase growing unit of the present invention.

This vapor-phase growing unit 10 is a batch-type of vertical vapor-phase growing unit, and is provided with a cylindrical reaction container 12 extending vertically. The reaction container 12 is made of, for example, quartz. An upper part of the reaction container 12 is closed.

A manifold 13 composed of a cylindrical stainless steel is connected to a lower end of the reaction container 12. A lid 14 is arranged under the manifold 13. This lid 14 is movable upward and downward by means of a boat-elevator (not shown).

When the lid 14 is raised, an opening at the lower end of the manifold 13 is adapted to be closed. Thereby, a sealed reaction chamber is formed in the reaction container 12.

A wafer-boat WB made of, for example, quartz is arranged on the lid 14 via a heat insulating cylinder 15. A substrate on which a vapor-phase-growth film is to be formed is a semiconductor wafer W made of, for example, silicon. A plurality of semiconductor wafers W (substrates) are held by the wafer-boat WB at predetermined vertical intervals. When the lid 14 is raised by the boat-elevator, the wafer-boat WB is inserted into the reaction container 12. Thereby, the wafers W held by the wafer-boat WB are arranged in a processing area in the reaction container 12.

The reaction container 12 has such a size that a cylindrical void is formed between an inside surface of the reaction container 12 and an outside periphery edge of the wafer boat WB or the wafers W in a condition wherein the wafer-boat WB has been inserted therein. A gas-introducing tube (to be described later) is arranged in the cylindrical void.

A cylindrical heater 16 composed of, for example, a resistive heating element is provided around the reaction container 12. By means of this cylindrical heater 16, the inside of the reaction container 12 and hence the wafers W placed on the wafer-boat WB are heated so as to be at a predetermined temperature.

A thermal insulator layer 18 is arranged outside the cylindrical heater 16. Furthermore, an outer shell 20 is provided so as to surround the thermal insulator layer 18. Additionally, another heater may be arranged above the reaction container 12 if required.

A plurality of gas-supplying tubes are provided in order to supply source gases into the reaction container 12. Specifically, a first gas-supplying tube 30 serving to supply an organic-metal including gas and a second gas-supplying tube 40 serving to supply oxygen gas are provided in such a manner that they extend to pierce a side wall of the manifold 13 at respective positions adjacent to each other.

The first gas-supplying tube 30 is connected to a gas source (not shown) of the source gas consisting of the organic-metal including gas, the gas source being provided outside of this vapor-phase growing unit 10. A lower end portion of the first gas-introducing tube 32 made of, for example, quartz, and located in the cylindrical void formed between the inside surface of the reaction container 12 and the outside periphery edge of the wafers W, is connected to and communicated with the leading end of the first gas-supplying tube 30 in the manifold 13.

Figure 3:
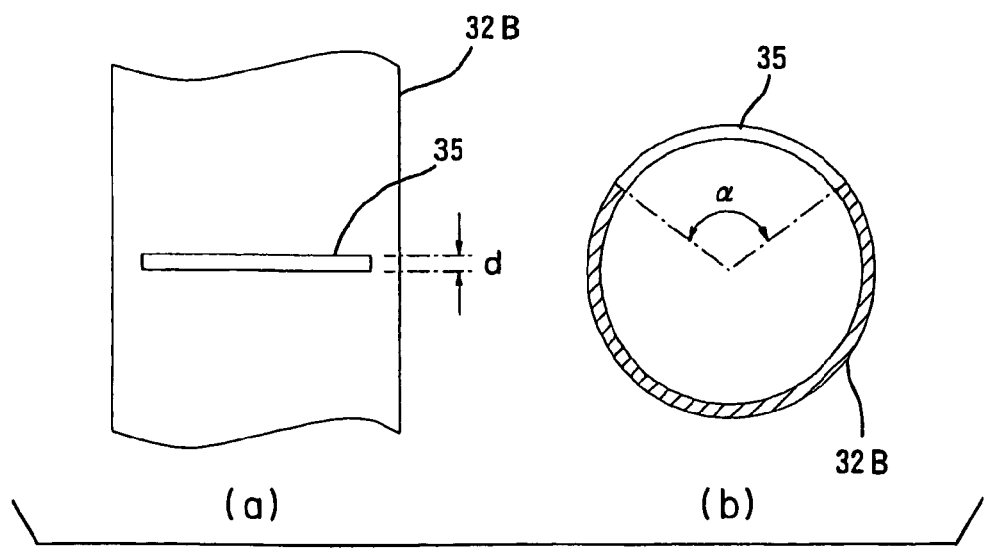
FIG. 3(a) is a partially enlarged front view of the first gas-introducing tube of FIG. 2.
FIG. 3(b) is an enlarged cross sectional view of the first gas-introducing tube of FIG. 2 taken along a gas-spouting port thereof.

FIG. 2 is a view of the first gas-introducing tube 32 seen from the center of a wafer W. FIG. 3(a) is a partially enlarged front view of the first gas-introducing tube 32 of FIG. 2, and FIG. 3(b) is an enlarged cross sectional view of the first gas-introducing tube 32 of FIG. 2 taken along a gas-spouting port 35.

Figure 4:
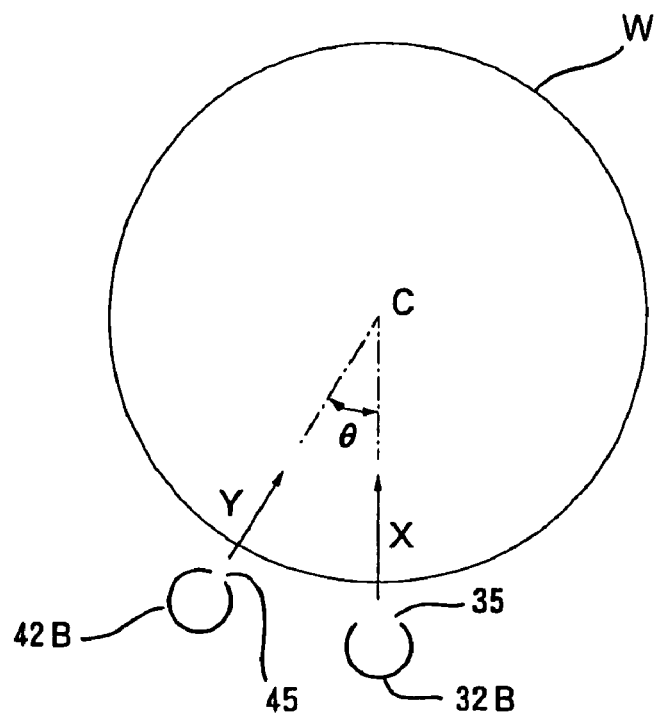
FIG. 4 is a view showing a positional relationship of a slit-like gas-spouting port of the first gas-introducing tube and a circular gas-spouting port of the second gas-introducing tube, with respect to the wafers.

Furthermore, FIG. 4 is a view showing a positional relationship between a slit-like gas-spouting port of the first gas-introducing tube and a circular gas-spouting port of the second gas-introducing tube, with respect to the wafers placed in the reaction container.

As shown in FIG. 2, the first gas-introducing tube 32 includes an introducing tube portion 32A extending upward in the cylindrical void in the reaction container 12, and a spouting tube portion 32B curving in a U-shape and extending downward from an upper end of the introducing tube portion 32A. The introducing tube portion 32A and the spouting tube portion 32B extend in parallel to each other. The spouting tube portion 32B and the introducing tube portion 32A are connected to each other by means of reinforcing bridge members 33 at appropriate positions.

In the spouting port portion 32B, many gas-spouting ports 35 (to be referred to as "slit-like spouting ports" hereinafter) formed by slit-like through holes respectively extending in circumferential directions of the tube (that is, in plane directions of the wafer W) are formed at appropriate intervals in a longitudinal direction of the spouting tube portion 32B.

Then, as shown in FIG. 4, a front-face direction of each slit-like spouting port 35 extending in a plane direction of a wafer W indicated by an arrow x is oriented toward the center C of the wafer W. Incidentally, in FIG. 4, the introducing tube portion 32A is omitted, and the spouting tube portion 32B is simply shown.

The size of the first gas-introducing tube 32 should not be limited especially, but can be suitably set according to various conditions. In one example, an outer diameter of the spouting tube portion 32B of the first gas-introducing tube 32 may be 16.8 to 17.2 mm, an inner diameter thereof may be 16.5 to 16.6 mm, and a wall thickness thereof may be 0.2 to 0.7 mm. Furthermore, a length of the slit-like spouting port 35 (along a circumferential direction of the tube at the spouting tube portion 32B) may be set in such a manner that an angle of aperture $\alpha$ (see FIG. 3(b)) is, for example, 30 to 160 degrees. Moreover, an opening depth (width) d (in a longitudinal direction of the tube at the spouting tube portion 32B) may be set in a range of 0.5 to 2.0 mm.

Figure 5:
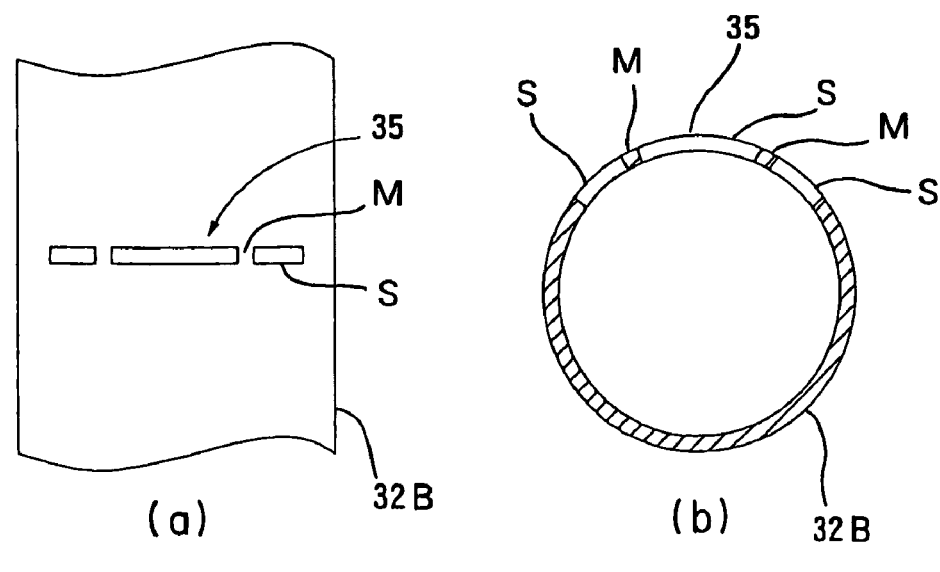
FIG. 5(a) is a partially enlarged front view of a first gas-introducing tube having a gas-spouting port of a modification example.
FIG. 5(b) is an enlarged cross sectional view of the first gas-introducing tube of FIG. 5(a) taken along the gas-spouting port thereof.

FIG. 5(a) and FIG. 5(b) show a modification example of the slit-like spouting port 35. FIG. 5(a) and FIG. 5(b) are illustrated similarly to FIG. 3(a) and FIG. 3(b), respectively. As is seen clearly from FIG. 5, it is not necessary for each slit-like spouting port 35 to be formed only by a single slit-like hole, but it is possible to be formed by a plurality of (three in the example of FIG. 5) slit-like holes S which are divided in a circumferential direction of the tube. For example, in the case of FIG. 5, there are intermediate wall portions M remained between the adjacent slit-like hole portions S. In this case, a large mechanical strength can be obtained due to the remains of the intermediate wall portions M.

The second gas-supplying tube 40 is arranged so as to pierce the surrounding wall of the manifold 13, similarly to the first gas-supplying tube 30. Then, the second gas-supplying tube 40 is connected to an oxygen gas source (not shown) provided outside of the vapor-phase growing unit 10. A lower end of the second gas-introducing tube (not shown in FIG. 1) made of, for example, quartz, and located in the cylindrical void formed between the inside surface of the reaction container 12 and the outside periphery edge of the wafers W, is connected to and communicated with the leading end of the second gas-supplying tube 40 in the manifold 13.

Figure 6:
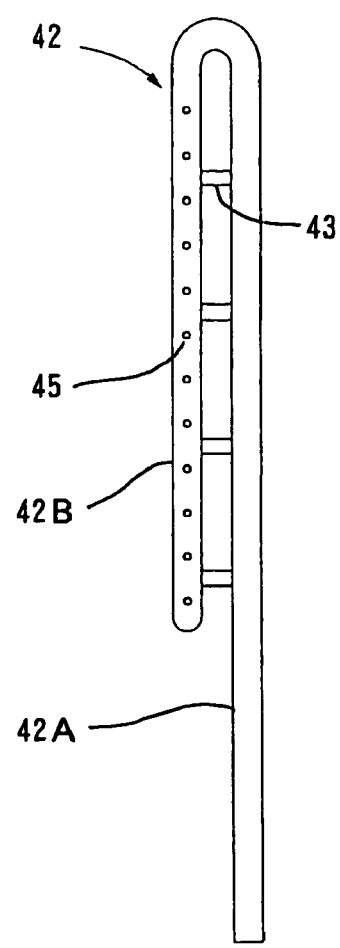
FIG. 6 is a schematic view of the second gas-introducing tube in FIG. 1 seen from the center of a wafer.
Figure 7:
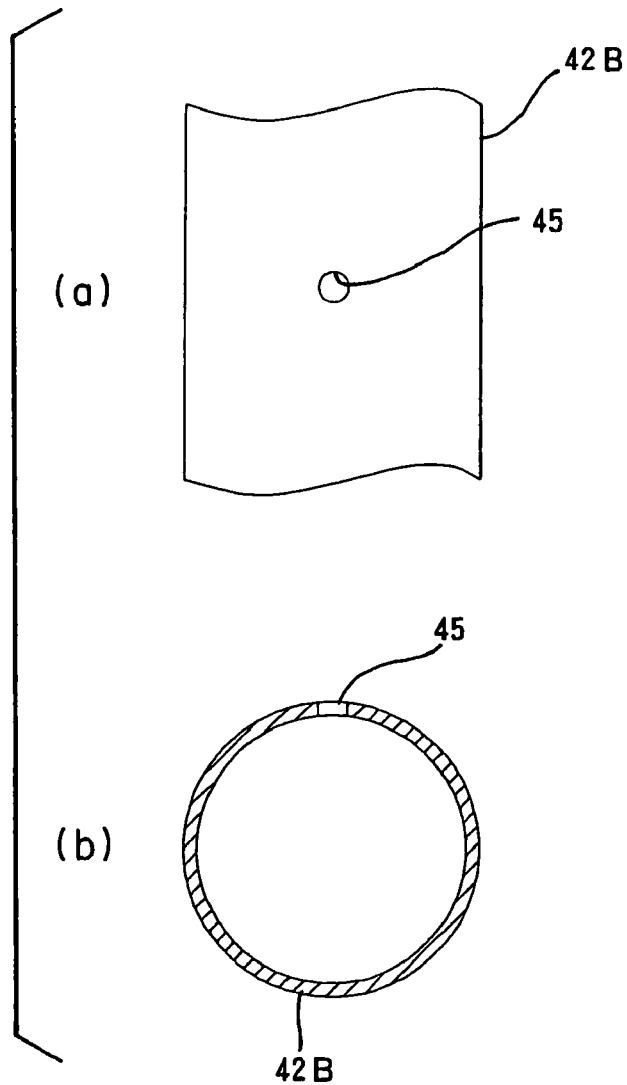
FIG. 7(a) is a partially enlarged front view of the second gas-introducing tube of FIG. 6.
FIG. 7(b) is an enlarged cross sectional view of the second gas-introducing tube of FIG. 6 taken along a gas-spouting port thereof.

FIG. 6 is a view of the second gas-introducing tube 42 seen from the center of a wafer. FIG. 7(a) is an enlarged front view of a portion of the second gas-introducing tube 42 including a gas-spouting port 45, and FIG. 7(b) is an enlarged cross sectional view of the second gas-introducing tube 42 taken along the gas-spouting port 45.

As shown in FIG. 6, the second gas-introducing tube 42 includes an introducing tube portion 42A extending upward in the cylindrical void in the reaction container 12, and a spouting tube portion 42B curving in a U-shape and extending downward from an upper end of the introducing tube portion 42A. The introducing tube portion 42A and the spouting tube portion 42B extend in parallel to each other. The spouting tube portion 42B and the introducing tube portion 42A are connected to each other by means of reinforcing bridge members 43 at appropriate positions.

In the spouting tube portion 42B, many gas-spouting ports 45 (to be referred to as "circular spouting ports" hereinafter) formed by circular through holes are formed at appropriate intervals in a longitudinal direction of the spouting tube portion 42B.

Then, as shown in FIG. 4, a front-face direction of each circular spouting port 45 in the spouting tube portion 42B indicated by an arrow y is oriented toward the center C of the wafer W. Incidentally, in FIG. 4, the introducing tube portion 42A is omitted, and the spouting tube portion 42B is simply shown.

Here, as for a tube for the second gas-introducing tube 42, the same as the above described tube for the first gas-introducing tube 32 may be used. The size of the circular spouting port 45 can be suitably set in accordance with various conditions. For example, its diameter is set to be 0.5 to 5.0 mm. It is also possible to form circular spouting port 45 by, for example, a plurality of circular through holes arranged in a line along the circumferential direction of the tube.

In the above description, the spouting tube portion 32B of the first gas-introducing tube 32 and the spouting tube portion 42B of the second gas-introducing tube 42 are arranged so as to be positioned closely to each other in an outer circumferential direction of the wafers W, as shown in FIG. 4. Furthermore, as described above, those gas-spouting ports, namely the slit-like spouting port 35 and the circular spouting port 45, are set in such a manner that the front-face directions thereof are both oriented to the center C of the wafer W.

In addition, it is necessary for the slit-like spouting port 35 and the circular spouting port 45 to be arranged alongside of each other under such a condition that an angle θ made by the respective front-face directions, namely an angle θ made by the arrow x and the arrow y in FIG. 4 (to be referred to as "an angle made by the spouting ports" hereinafter) is small. Practically, it is important for this angle θ made by the spouting ports to be not larger than 45 degrees. In particular, the angle θ made by the spouting ports is preferably no larger than 10 degrees. In this case, it is possible to form a vapor-phase-growth film having a significantly high uniformity.

Incidentally, although there is no lower limit to degree for the angle θ made by the spouting ports in principle, the lower limit may be naturally determined by a tube diameter of the sporting tube portion 32B and a tube diameter of the spouting tube portion 42B.

In addition, with reference to FIG. 1, an exhausting port 19 is provided in the manifold 13 at an opposite position with respect to the position through which the first gas-supplying tube 30 and the second gas-supplying tube 40 pass. A vacuum pump (not shown) is connected to the exhausting port 19 via an exhausting tube that has an adjusting valve inserted therein.

Furthermore, a control system (not shown) is provided in order to control a gas supply by means of the first gas-introducing tube 30, a gas supply by means of the second gas-supplying tube 40, an operation of the cylindrical heater 16, and operational conditions of the adjusting valve and the vacuum pump connected to the exhausting port 19. Specifically, this control system may be composed of a microprocessor, a process controller, and the like, and may have a function to send control signals to those parts to control them, based on a predetermined program.

Using the vapor-phase growing unit 10 having the above described composition, it is possible to form a vapor-phase-growth film on a surface of a wafer, which will be described below.

First, the wafer-boat WB holding wafers W that are substrates on which vapor-phase-growth films are to be formed, is placed on the lid 14 located at a lowered position. Thereafter, the lid 14 is raised by the not-shown boat-elevator. Thereby, the wafer-boat WB is inserted into the reaction container 12 and the wafers W are placed in the reaction container 12. At this time, the lid 14 closes the opening at the lower end of the manifold 13. This makes the inside of the reaction container 12 be sealed.

On the other hand, the inside of the reaction container 12 is set to be under a set reduced pressure, through the exhausting tube 19. In addition, the inside of the reaction container 12 is heated by the cylindrical heater 16 to be maintained at a set temperature.

The reduced pressure and the temperature may be suitably selected according to a type of the objective vapor-phase-growth film, a kind and a flow rate of the source gas in use, and other conditions.

As for an example of condition on the atmosphere in the reaction container 12, the pressure is, for example, 67 to 670 Pa (0.5 to 5.0 Torr) and the temperature is 300 to 600° C.

Then, under such a state wherein the set reduced pressure condition and the temperature condition are maintained, the respective source gases of certain required amounts are supplied through the first gas-supplying tube 30 and the second gas-supplying tube 40, so as to form the vapor-phase-growth film.

The source gases supplied through the first gas-supplying tube 30 and the second gas-supplying tube 40 may be different depending on a kind of the objective vapor-phase-growth film. In this embodiment, an organic-metal including gas is used as the first gas supplied through the first gas-supplying tube 30. On the other hand, a reaction gas, which may react with the organic-metal including gas supplied through the first gas-supplying tube 30 and which has a density smaller than that of the organic-metal including gas, is used as the second gas supplied through the second gas-supplying tube 40.

It is possible to set a supplying ratio of the respective source gases in accordance with a condition to form the vapor-phase-growth film in the objective state.

Specific combinations of an organic-metal including gas (first gas) used to form the vapor-phase-growth film and a reaction gas (second gas) used therewith may be as follows, but they are not restricted thereto.

(1) Combination of $Sr[[(CH_3)_3CCO]_2CH]_2$ Gas (To be Referred to as "$Sr(DPM)_2$ Gas" Below) and $O_2$ Gas According to this combination, a vapor-phase-growth film made of SrO is formed.

(2) Combination of $Ti(OC_3H_7\text{-}i)_2[[(CH_3)_3CCO]_2CH]_2$ Gas and $O_2$ Gas According to this combination, a vapor-phase-growth film made of $TiO_2$ is formed.

(3) Combination of $TiCl_4$ Gas and $NH_3$ Gas

According to this combination, a vapor-phase-growth film made of TiN is formed.

(4) Combination of $Zr[OC(CH_3)_3]_4$ Gas and $O_2$ Gas

According to this combination, a vapor-phase-growth film made of $ZrO_2$ is formed.

(5) Combination of $Ta(OC_2H_5)_5$ Gas and $O_2$ Gas

According to this combination, a vapor-phase-growth film made of $Ta_2O_5$ is formed.

It is not necessary for each of the above combinations to be employed individually. For example, it is possible to employ combinations of the above (1) and (2) together. In this case, a vapor-phase-growth film made of $SrTiO_3$ can be formed by using a mixture gas of the $Sr(DPM)_2$ gas and the $Ti(OC_3H_7\text{-}i)_2[[(CH_3)_3CCO]_2CH]_2$ gas, and the oxygen gas.

For example, when forming the vapor-phase-growth film by using the above combination (1), the $Sr(DPM)_2$ gas is supplied to the first gas-supplying tube 30 at a rate of, for example, 0.3 to 1.0 slm, the oxygen gas is supplied to the second gas-supplying tube 40 at a rate of, for example, 1.0 to 10.0 slm, and the inside of the reaction container 12 is maintained at a reduced pressure of 67 to 670 Pa (0.5 to 5.0 Torr) and at a temperature of 300 to 600° C.

A required time to form the film differs depending on a size of the objective film thickness, but it takes, for example, 10 to 40 minutes. This enables the vapor-phase-growth film to be formed with the film thickness of, for example, 5 to 20 nm.

In the above vapor-phase-growth film formation, the organic-metal including gas supplied from the first gas-supplying tube 30 reaches the spouting tube portion 32B of the first gas-introducing tube 32 in the reaction container 12 so as to be spouted along the surfaces of the wafers W and toward the centers C of the wafers W from the respective slit-like spouting ports 35 formed in the spouting tube portion 32B.

Concurrently with this, the oxygen gas supplied from the second gas-supplying tube 40 reaches the spouting tube portion 42B of the second gas-introducing tube 42 in the reaction container 12 so as to be spouted along the surfaces of the wafers W and toward the centers C of the wafers W from the respective circular spouting ports 45 formed in the spouting tube portion 42B.

Since the slit-like spouting ports 35 are formed by the slit-like through holes respectively extending in horizontal directions along the surfaces of the wafers W, the organic-metal including gas spouted from the slit-like through holes 35 is adapted to be diffused broadly along the surfaces of the wafers W also in orthogonal directions (lateral directions) with respect to the arrow x direction (the front-face direction).

However, since the organic-metal including gas includes a metal element in its composition, it is a gas of a high density, and heavy. Therefore, it is difficult for the organic-metal including gas to be diffused distantly from the slit-like spouting ports 35 in the x direction. Hence, it has been almost impossible to suppress ununiformity of the film thickness in the x direction in the prior art.

According to this embodiment, when the organic-metal including gas is spouted from the spouting tube portion 32B, the oxygen gas is spouted from the circular spouting ports 45 of the second gas-introducing tube 42. The oxygen gas is a gas of a low density, and light. Accordingly, the oxygen gas spreads broadly along the surfaces of the wafers W so as to be diffused with a high uniformity, independently of the shapes of the spouting ports, that is, even though each spouting port has the circular shape.

On the other hand, each of the circular spouting ports 45 serving as the spouting ports of the oxygen gas and each of the slit-like spouting ports 35 serving as the spouting ports of the organic-metal including gas are arranged closely to each other in a line along the outer circumferential direction of the wafers W. Therefore, the organic-metal including gas spouted from the slit-like spouting ports 35 is subjected to action of flow of the oxygen gas, that is, the organic-metal including gas is adapted to be expanded and diffused by the diffusing action of the oxygen gas. As a result, it is possible to obtain a high uniformity in the film thickness in a more distant area even in the x direction.

As the above result, both of the organic-metal including gas and the oxygen gas are adapted to be diffused with the respective high uniformity on the surfaces of the wafers W. Therefore, it is possible to form a vapor-phase-growth film having a high uniformity in its film thickness as well as in its film quality.

In the above vapor-phase growing unit 10, the respective gas-introducing tubes (the first gas-introducing tube 32 and the second gas-introducing tube 42) are both composed of the introducing tube portions (32A and 42A) extending upward, and the spouting tube portions (32B and 42B) curving from the upper ends of the introducing tube portions downward in a U-shape, in the reaction container 12. This arrangement is suitable because of the following reason. That is, in this embodiment, the reaction container 12 has a so-called single tube structure, and an exhausting operation for reducing the pressure in the reaction container 12 is performed through the exhausting port 19 at the lower part. Therefore, by using the spouting tube portions (32B and 42B) extending downward, it is possible to decrease difference in spouting pressure caused by difference in level of the respective spouting ports formed at appropriate intervals in the longitudinal direction. Accordingly, it is possible to obtain a more uniform spouting state as a whole.

Figure 8:
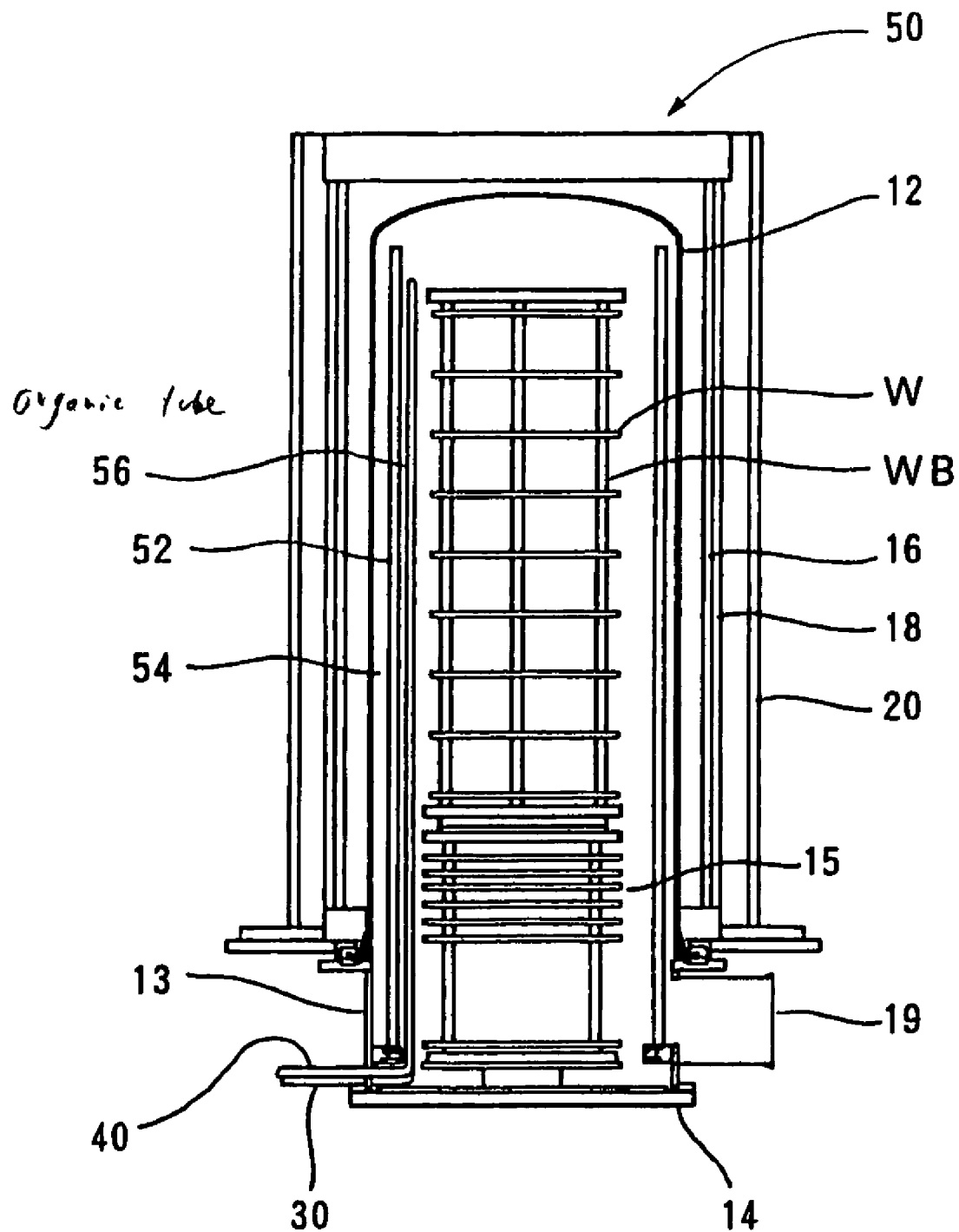
FIG. 8 is a schematic cross sectional view showing a vapor-phase growing unit according to another embodiment of the present invention.
Figure 9:
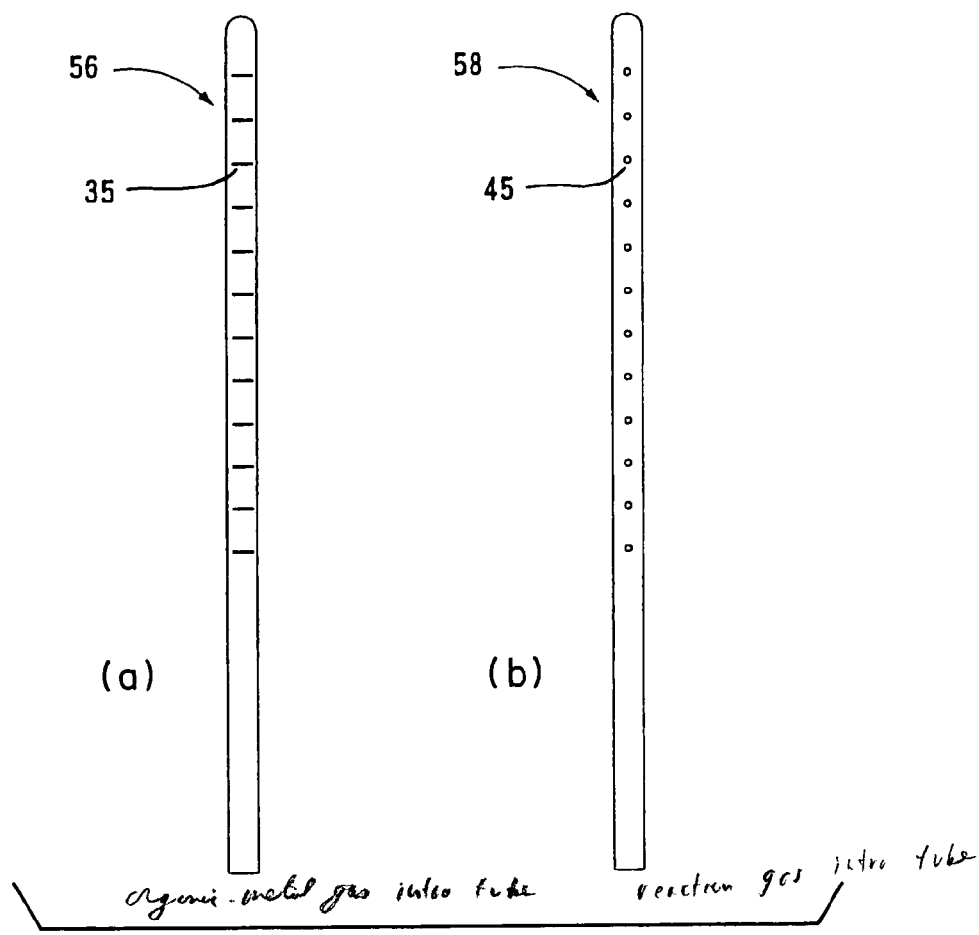
FIG. 9(a) is a front view of the first gas-introducing tube in the vapor-phase growing unit of FIG. 8.
FIG. 9(b) is a front view of the second gas-introducing tube in the vapor-phase growing unit of FIG. 8.

FIG. 8 is a view schematically showing another example of vapor-phase growing unit of the present invention. FIG. 9 is a view for explaining the first gas-introducing tube and the second gas-introducing tube in the vapor-phase growing unit of FIG. 8.

The vapor-phase growing unit 50 of FIG. 8 basically has the same composition as the vapor-phase growing unit 10 of FIG. 1, but differs in the following points. That is, an inner tube 52, whose upper part is opened, is provided along an inside circumferential wall of a reaction container 12 in the vapor-phase growing unit 50 (double tube type). Accordingly, a cylindrical room 54 is formed between the inner tube 52 and the reaction container 12. An exhausting port 19 is connected to a lower part of the cylindrical room 54.

Then, as shown in FIG. 9(a), a first gas-introducing tube 56 connected to a first gas-supplying tube 30 is composed of a straight-type tube extending simply upward. Slit-like spouting ports 35 are formed in the first gas-introducing tube 56. As shown in FIG. 9(b), a second gas-introducing tube 58 connected to a second gas-supplying tube 40 is also composed of a straight-type tube extending simply upward. Circular spouting ports 45 are formed in the second gas-introducing tube 58.

In the double-tube type of composition, exhaustion is performed from an upper portion in the reaction container 12 through the annular room 54. Therefore, by using the gas-introducing tubes 56 and 58 made of the straight-type tubes, it is possible to decrease difference in spouting pressure caused by difference in level of the respective spouting ports formed at appropriate intervals in the longitudinal direction, similarly to the above cases shown in FIGS. 1 to 7. Accordingly, it is possible to obtain a more uniform spouting state as a whole.

The embodiments of the vapor-phase growing unit and the method of forming a vapor-phase-growth film according to the invention are specifically described as above, but it is possible to add various modifications to the above embodiments.

For example, the above vapor-phase growing unit is batch-type, but it can be composed as a single-wafer type of vapor-phase growing unit.

As for a gas-spouting port of a first gas-introducing tube serving to introduce an organic-metal including gas, it is preferable that it has such an aspect that the organic-metal including gas is diffused sufficiently broadly in the lateral direction. That is, a gas-spouting port of a first gas-introducing tube is preferably formed by a slit-like through hole, as described above. However, in the present invention, as for a gas-spouting port of a first gas-introducing tube, it may be formed by a circular through hole.

On the other hand, as for a gas-spouting port of a second gas-introducing tube serving to introduce a source gas other than the organic-metal including gas, even though the spouting port is formed by a circular through hole, it is possible to obtain a sufficiently spread diffusion state. Therefore, it is not necessary for a gas-spouting hole of a second gas-introducing tube to be formed by a slit-like through hole, but it may be formed like that.

That is, in the present invention, it is suitable that a gas-spouting port of a first gas-introducing tube is formed by a slit-like spouting port and that a gas-spouting port of a second gas-introducing tube is formed by a circular spouting port, but combinations of other shapes should not be eliminated.

Experimental Example 1

An experiment was conducted, in which a vapor-phase-growth film was formed on a surface of a silicon wafer having a diameter of 8 inches, by using a vapor-phase growing unit composed as shown in FIG. 1, under a condition shown in the following Table 1.

TABLE 1

| <vapor-phase growing unit> | | |
|---|---|---|
| (1) outer diameter of the spouting tube portion 32B of the first gas-introducing tube 32: | 17.0 | mm |
| inner diameter thereof: | 14.0 | mm |
| angle of aperture α of the slit-like spouting port 35: | 123 | degrees |
| opening depth d thereof: | 0.24 | mm |
| (2) outer diameter of the spouting tube portion 42B of the second gas-introducing tube 42: | 17.0 | mm |
| inner diameter thereof: | 14.0 | mm |
| diameter of the circular spouting port 45: | 2.0 | mm |
| (3) angle θ made by the spouting ports: | 10 | degrees |
| <formation of the vapor-phase-growth film> | | |
| (1) organic-metal including gas (type) Sr(DPM)$_2$ gas (flow rate) | 0.6 | slm |
| (2) oxygen gas (flow rate) | 5.0 | slm |
| (3) oxygen gas: condition of vapor-phase growth pressure in the reaction container 12 | 100 | Pa |
| temperature therein | 475° | C. |

Figure 10:
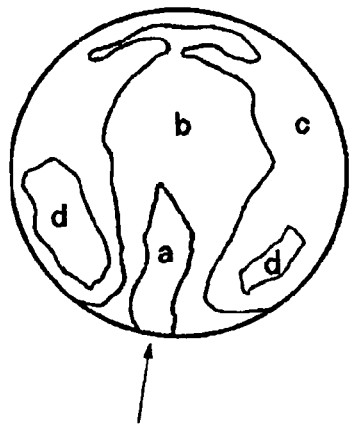
FIG. 10 is an isopycnic-curve chart showing a distribution state of $Sr(DPM)_2$ gas on a surface of a wafer measured in an experimental example 1.

FIG. 10 shows an isopycnic-curve chart showing a distribution state of the Sr(DPM)$_2$ gas on the surface of the wafer measured in the above experiment. In FIG. 10, the round shape indicates the outside periphery boarder of the wafer. Values a to d are marks stepwise showing the distributing degree of the Sr(DPM)$_2$ gas. Their specific values are shown as follows.

a: 2.40 to 2.00 (kg/m$^2$)
b: 2.00 to 1.60 (kg/m$^2$)
c: 1.60 to 1.20 (kg/m$^2$)
d: 1.20 to 0.80 (kg/m$^2$)

That is, in the state shown in FIG. 10, it is understood that difference between the stage a of the maximum density and the stage d of the minimum density is no more than 1.60 (kg/m$^2$) at most.

Figure 11:
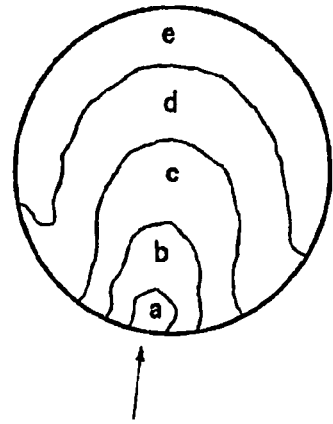
FIG. 11 is an isopycnic-curve chart showing a distribution state of oxygen gas on a surface of a wafer measured in the experimental example 1.

FIG. 11 is also an isopycnic-curve chart showing a distribution state of the oxygen gas. Each range of a to e in FIG. 11 are as follows.

a: 2.90 to 2.85 (kg/m$^2$)
b: 2.85 to 2.80 (kg/m$^2$)
c: 2.80 to 2.75 (kg/m$^2$)
d: 2.75 to 2.70 (kg/m$^2$)
e: 2.70 to 2.65 (kg/m$^2$)

Experimental Example 2

An experiment of a vapor-phase-growth film formation was conducted under the exactly same condition as the above experimental example 1, except that the angle θ made by the spouting ports is changed to 40 degrees. As a result, the distribution state in the isopycnic-curve chart of the Sr(DPM)$_2$ gas included the following six stages. A vapor-phase-growth film having a sufficiently high uniformity in view of practical use was formed, although the uniformity of the film was lower than that in the experimental example 1.

(1) 3.20 to 2.80 (kg/m$^2$)
(2) 2.80 to 2.40 (kg/m$^2$)
(3) 2.40 to 2.00 (kg/m$^2$)
(4) 2.00 to 1.60 (kg/m$^2$)
(5) 1.60 to 1.20 (kg/m$^2$)
(6) 1.20 to 0.80 (kg/m$^2$)

As is understood by the experimental example 2, it is possible to form a vapor-phase-growth film having a relatively high desired uniformity, even though the angle θ made by the spouting ports is 40 degrees.

Additionally, by comparison of the experimental example 1 and the experimental example 2, it is also obvious that an excellent result with a higher uniformity can be attained when the angle θ made by the spouting ports is so small as, for example, 10 degrees or less.

Comparison Experimental Example

On the other hand, an experiment, in which only the Sr(DPM)$_2$ gas was supplied while stopping supply of the oxygen gas, was conducted for comparison. Except this condition, the experiment was conducted under the same condition as the above examples. As a result, there are ten stages from the maximum density stage of 4.00 to 3.60 (kg/m$^2$) to the minimum density stage of 0.40 to 0.00 (kg/m$^2$) in the distribution state in the isopycnic curve of the Sr(DPM)$_2$ gas. That is, the difference between the maximum density stage and the minimum density stage ranges so widely as 3.60 (kg/m$^2$) at most, that is, the ununiformity is large.

Taking the above examples into consideration, it is obvious that the Sr(DPM)$_2$ gas is broadly diffused along the surface of the wafer W when the oxygen gas is spouted from the circular gas-spouting port arranged along with the slit-like gas-spouting port, whereby a vapor-phase-growth film having a sufficiently high uniformity is formed.

The invention claimed is:

1. A method of forming a vapor-phase-growth film on a surface of a substrate by using a vapor-phase growing unit, the vapor-phase growing unit including:

a reaction container in which a substrate is arranged, a first gas-introducing part having a first gas-introducing tube in which a gas-spouting port opening in the reaction container is formed, the first gas-introducing part serving to supply into the reaction container a first gas consisting of a metal including gas, and a second gas-introducing part having a second gas-introducing tube in which a gas-spouting port opening in the reaction container is formed, the second gas-introducing part serving to supply into the reaction container a second gas which reacts with the metal including gas and whose density is smaller than that of the metal including gas, the gas-spouting port of the first gas-introducing tube being formed by a slit-like through hole that opens in a direction parallel to a surface of the substrate, the gas-spouting port of the second gas-introducing tube being formed by a circular through hole, the gas-spouting port of the first gas-introducing tube and the gas-spouting port of the second gas-introducing tube being arranged along an outside periphery of each of the substrates arranged in the reaction container;

the method comprising:

a step of supplying the first gas from the gas-spouting port of the first gas-introducing tube into the reaction container in a first path to the center of the substrate, and a step of supplying the second gas from the gas-spouting port of the second gas-introducing tube into the reaction container in a second path that intersects the first path at the center of the substrate, wherein a flow of the second gas introduced into the reaction container through the gas-spouting port of the second gas-introducing tube causes the first gas introduced into the reaction container through the gas-spouting port of the first gas-introducing tube to be dispersed along a surface of the substrate, and wherein an angle wherein an angle formed by the intersection between the first path and the second path is no larger than 10 degrees.

2. A method according to claim 1, wherein the step of supplying the first gas from the gas-spouting port of the first gas-introducing tube into the reaction container and the step of supplying the second gas from the gas-spouting port of the second gas-introducing tube into the reaction container are conducted at the same time.

3. A method according to claim 2, wherein each of the first gas and the second gas is any of
(1) $Sr[[(CH_3)_3CCO]_2CH]_2$ gas and $O_2$ gas,
(2) $Ti(OC_3H_7\text{-i})_2[[(CH_3)_3CCO]_2CH]_2$ gas and $O_2$ gas,
(3) $TiCl_4$ gas and $NH_3$ gas,
(4) $Zr[OC(CH_3)_3]_4$ gas and $O_2$ gas, and
(5) $Ta(OC_2H_5)_5$ gas and $O_2$ gas.

4. A method according to claim 1, wherein each of the first gas and the second gas is any of
(1) $Sr[[(CH_3)_3CCO]_2CH]_2$ gas and $O_2$ gas,
(2) $Ti(OC_3H_7\text{-i})_2 [[(CH_3)_3CCO]_2CH]_2$ gas and $O_2$ gas,
(3) $TiCl_4$ gas and $NH_3$ gas,
(4) $Zr[OC(CH_3)_3]_4$ gas and $O_2$ gas, and
(5) $Ta(OC_2H_5)_5$ gas and $O_2$ gas.

* * * * *